United States Patent
Ikeda et al.

(10) Patent No.: US 6,238,221 B1
(45) Date of Patent: May 29, 2001

(54) CIRCUIT CONNECTION STRUCTURE FOR A JUNCTION BLOCK

(75) Inventors: Keizo Ikeda, Nagoya; Yoshihiro Isshiki, Yokkaichi, both of (JP)

(73) Assignees: Harness System Technologies Research, Ltd., Nagoya; Sumitomo Wiring Systems, Ltd., Mie; Sumitomo Electric Industries, Ltd., Osaka, all of (JP)

(*) Notice: Subject to any disclaimer, the term of this patent is extended or adjusted under 35 U.S.C. 154(b) by 0 days.

(21) Appl. No.: 09/521,948

(22) Filed: Mar. 9, 2000

(30) Foreign Application Priority Data

Mar. 11, 1999 (JP) .................................................. 11-064320

(51) Int. Cl.⁷ .............................. H01R 12/06; H05K 1/00
(52) U.S. Cl. ........................................ 439/76.2; 439/949
(58) Field of Search ................................ 439/76.2, 949, 439/404, 443

(56) References Cited

U.S. PATENT DOCUMENTS

| | | | |
|---|---|---|---|
| 4,820,192 | * | 4/1989 | Denkmann et al. ............ 439/404 |
| 5,091,826 | | 2/1992 | Arnett et al. . |
| 5,484,186 | * | 1/1996 | Van Order et al. ............. 296/97.5 |
| 5,764,487 | | 6/1998 | Natsume . |
| 5,888,088 | * | 3/1999 | Kobayashi et al. ............. 439/404 |

FOREIGN PATENT DOCUMENTS

| | | |
|---|---|---|
| 0 572 052 A1 | 12/1993 | (EP) . |
| 5-300627 | 11/1993 | (JP) . |
| 9-009457 | 1/1997 | (JP) . |
| 9-9457 | 1/1997 | (JP) . |
| 9-312919 | 12/1997 | (JP) . |

* cited by examiner

Primary Examiner—Brian Sircus
Assistant Examiner—Brian S. Webb
(74) Attorney, Agent, or Firm—Oliff & Berridge, PLC

(57) ABSTRACT

To provide a circuit connection structure for a junction block which can improve the reliability in circuit connection while trying to reduce a space needed for circuit connection. A wiring pattern 11 is provided on a printed-wiring board 10, and electronic components 12 are mounted on the printed-wiring circuit board 10. A slit 13 is formed in a substrate main body 10a of the printed-wiring board 10, and a land portion 14 is provided on each side of the slit 13. The land portion 14 is connected to the wiring pattern 11. A single-core wire 15 is disposed so as to extend between the land portions 14 and is soldered thereat. One end portion of a pressure connecting terminal 18 is pressure connected to a single-core wire 17 within a junction block, while the other end portion of the pressure connecting terminal 18 is bite connected to the single-core wire 17 through the slit 13.

5 Claims, 4 Drawing Sheets

PRIOR ART

CIRCUIT CONNECTION STRUCTURE FOR A JUNCTION BLOCK

BACKGROUND OF THE INVENTION

1. Field of the Invention

The present invention relates to a circuit connection structure for a junction block in which electronic components constituting an electronic control unit are installed.

2. Description of the Related Art

Conventionally, in a junction block-related product having installed therein various types of electronic components, normally used as a circuit connection structure for connecting a cabling conductive portion within a junction block with a circuit conductive portion on a printed-wiring board 5 on which electronic components constituting an electronic control unit are mounted is a method for connecting the cabling conductive portion with the circuit conductive portion on the printed-wiring board comprising the steps of mounting a connector 3 in which a junction terminal 1 is mounted in a housing 2 on a printed-wiring board 5 with soldering 4 or the like, and connecting a bus bar 6 constituting the wiring conductive portion within the junction block with the junction terminal 1.

For instance, such a method is disclosed in JP-A-9-9457.

According to the aforesaid conventional circuit connection structure for a junction block, however, a space greater than an actual connecting portion needs to be secured due to the existence of the housing 2 retaining the junction terminal 1, and a problem results therefrom that the enlargement of the junction block is entailed.

In addition, thermal stress and stress due to vibration is applied differently to the soldered portion 4 where the junction terminal 1 and the printed-wiring board 5 are soldered to each other for every mode of utilizing a junction block having various types electronic control units installed therein, and therefore, a reliability confirmation has been needed.

SUMMARY OF THE INVENTION

To cope with this, an object of the present invention is to provide a circuit connection structure for a junction block that is intended to reduce a space required for circuit connection and which can improve the reliability in such a circuit connection.

According to a first aspect of the invention, there is provided a circuit connection structure for a junction block for connecting a circuit conductive portion of a printed-wiring board with a cabling conductive portion within the junction block, characterized in that, a slit is formed in a substrate main body of the printed-wiring board, land portions being provided on both sides of said slit, at least one of the land portions being connected to the circuit conductive portion, an electric wire disposed to extend between the land portions being soldered to the land portions, and in that a pressure connecting terminal member provided on the cabling conductive portion and having a biting connection groove for the electric wire bites on the electric wire for connection therewith through the slit.

According to a second aspect of the invention, the electric wire is a single-core wire having a core portion comprising a single conductive wire.

According to a third aspect of the invention, a plurality of the land portions are provided on each side of the slit in such a manner as to confront each other across the slit, that the electric wire is soldered, respectively, to the plurality of the confronting land portions on each side of the slit, the electric wire each being disposed to extend between the confronting land portions, and that a plurality of the pressure connecting terminal portions are provided for biting on the respective electric wires for connection therewith.

According to a fourth aspect of the invention, a plurality of the slits are formed in the substrate main body, that the land portions are provided on both sides of each of the plurality of the slits and the electric wire is soldered to the land portions on the both sides of each of the plurality of the slits, the electric wire being disposed to extend between the land portions, and that the pressure connecting terminal member is provided for the respective electric wires for bite connecting therewith.

DETAILED DESCRIPTION OF THE PREFERRED EMBODIMENTS

Figure 1:
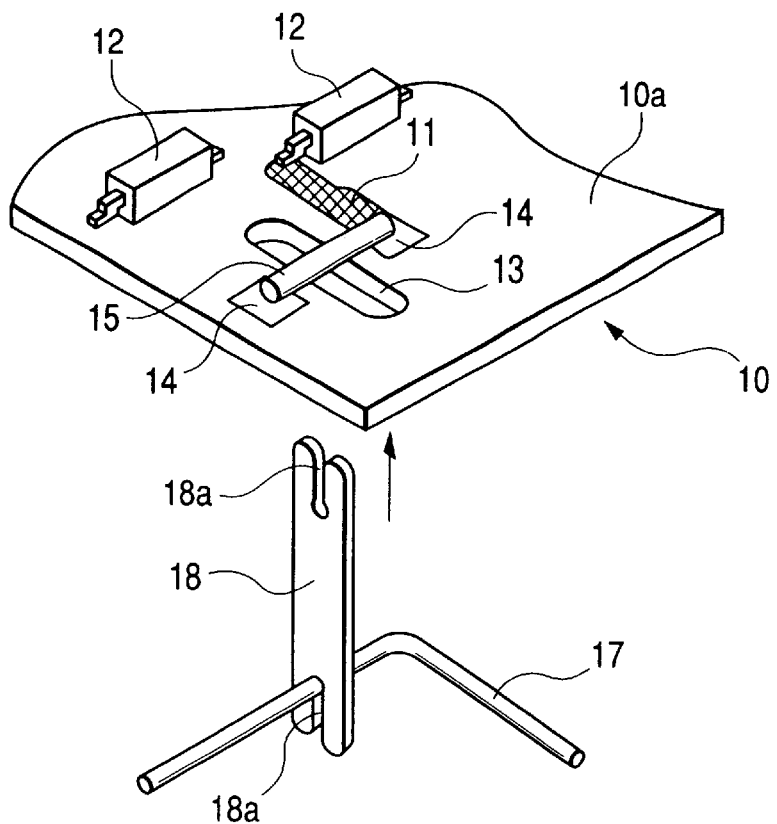
FIG. 1 is an exploded perspective view showing a main part of a first embodiment of the present invention.
Figure 2:
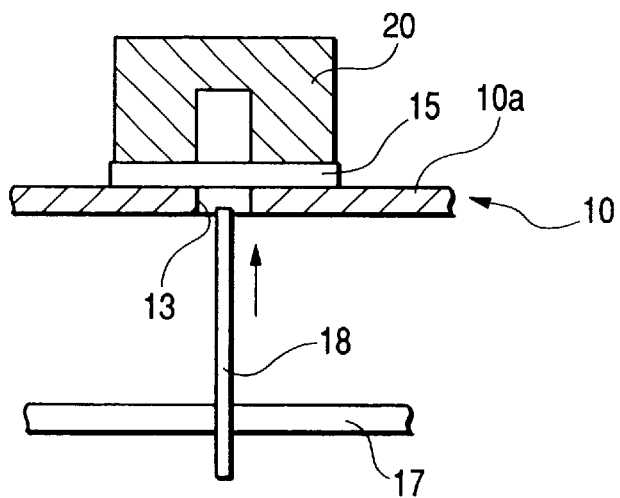
FIG. 2 is an explanatory view explaining the assembly of the first embodiment.

Referring to the drawings, a first embodiment of the present invention will be described below. As shown in FIGS. 1 and 2, a wiring pattern 11 as a circuit conductive portion is suitably formed on a substrate main body 10a of a printed-wiring board 10, and suitably mounted at predetermined positions on the wiring pattern 11 are electronic components 12 constituting an electronic control unit such as IC's, resistances and capacitors.

In addition, an elongated slit 13 is formed in a predetermined position on the substrate main body 10, and land portions 14 are formed at positions on both sides of the slit 13 in the surface of the substrate main body 10a. Then, at least one of the land portions is in connection with the wiring pattern 11.

Furthermore, a single-core wire 15 (electric wire) of a suitable length which comprises a conductive wire having a single core portion is disposed to extend between the land portions 14 formed on the both sides of the slit and is soldered to the land portions 14.

In this case, the surface mounting method is adopted for soldering the single-core wire 15, and, for example, the single-core wire 15 is mounted on the respective land portions 14 through the flow soldering with cream solder.

In addition, in FIGS. 1 and 2, reference numeral 17 denotes a single-core wire as a cabling conductive portion within a junction block, and a pressure connecting terminal 18 as a pressure connecting terminal member is connected to the single-core wire at a suitable position thereof. In other words, the pressure connecting terminal 18 comprises an elongated bus bar unit and is constructed as a double-teeth structure in which biting connection grooves 18a are provided on both ends of the pressure connecting terminal 18, which biting connection grooves each have opposite pressure connecting teeth adapted to bite on a coated portion of the electric wire for pressure connection with the core portion of the electric wire. Then, the pressure connecting terminal 18 is bite connected to the single-core wire 17 using the bite connecting groove 18a formed in a lower portion thereof, whereby the pressure connecting terminal 18 is provided on the single-core wire 17 in such a manner as to erect therefrom.

Then, an upper portion of the pressure connecting terminal 18 is inserted through the slit 13 from below for biting connection with the single-core wire 15 at the upper side bite connecting groove 18a, whereby the wiring pattern 11 of the printed-wiring board 10 and the single-core wire 17 of the junction block are connected to each other.

As shown in FIG. 2, when a presser fixture 20 extending over the slit 13 for pressing against end portions of the single-core wire 15 is used in pressure connecting the single-core wire 15 with the pressure connecting terminal 18, it is possible to effectively avoid a risk of stress being generated at a soldered portion where the land portions 14 and the single-core wire 15 are soldered during the pressure connecting of the both members.

According to the circuit connection structure of the embodiment of the present invention, the housing 2 conventionally used is no longer needed, and hence the structure is advantageous in the economy of space and reduction in the number of components used and space needed for the circuit connection, and the structure also helps make the junction block compact.

In addition, stress relaxation or stress adjustment can be effected against thermal stress or stress due to vibration by controlling the elasticity of the single-core wire 15 itself mounted on the printed-wiring boar 10 and the length of the single-core wire 15, whereby the reliability can be improved.

Furthermore, since the conventionally used housing 2 is no longer required, the circuit connection structure can easily be applied to any position on the printed-wiring board, and this improves the degree of freedom in designing cabling for the junction block.

While the construction is illustrated as an example of the electric wire in which the single-core wire 15 comprising a single conductive wire is used, an electric wire may be used in which the core portion comprises a plurality of twisted wires. In view of the nature of the pressure connecting structure, the single-core wire 15 is preferred.

Figure 3:
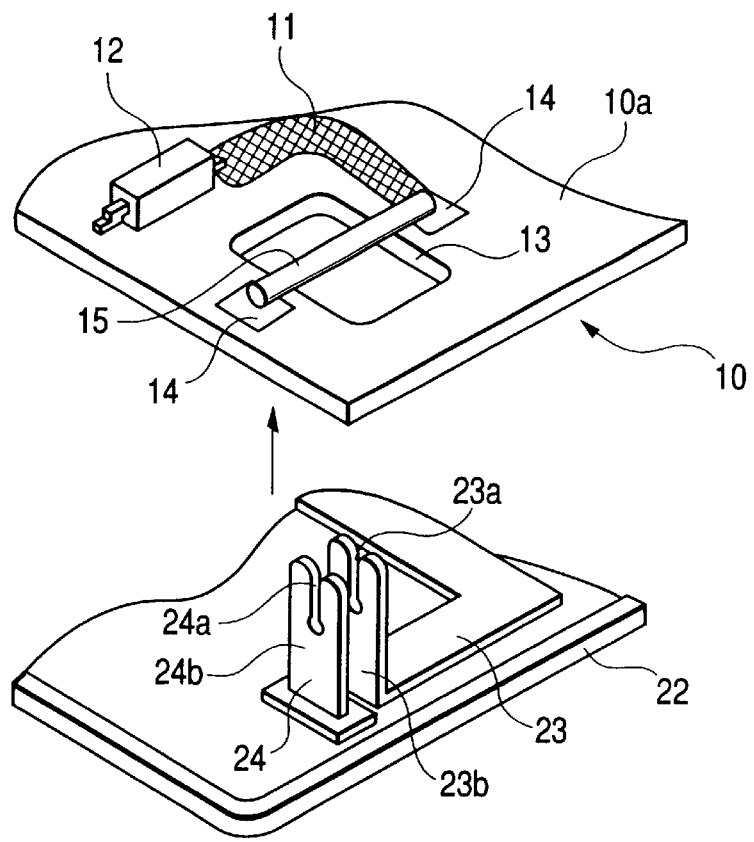
FIG. 3 is an exploded perspective view showing a second embodiment of the present invention.
Figure 4:
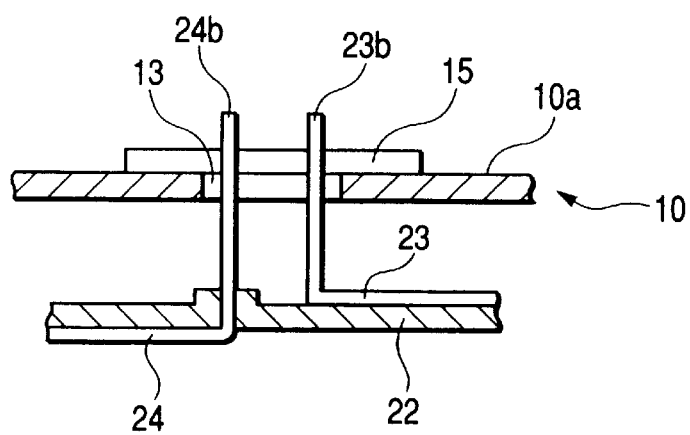
FIG. 4 is a sectional view showing the second embodiment.

FIGS. 3 and 4 show a second embodiment, and like reference numerals are given to constituent components like to those described in the aforesaid first embodiment, and the description thereof will be omitted.

Namely, in this embodiment, the slit 13 is formed wider. In addition, the cabling conductive portion within the junction block comprises bus bars 23, 24 disposed, respectively, on upper and lower sides of an insulating panel 22, and an end portion of the bus bar 23 disposed on the upper side is bent upwardly so as to form a pressure connecting terminal 23b as a pressure connecting terminal member comprising a bite connecting groove 23a formed in an upper end of the bus bar end portion at an intermediate position in a transverse direction thereof and having opposite pressure connecting teeth.

On the other hand, an end portion of the bus bar 24 on the lower side of the insulation panel 22 is formed so as to erect upwardly through the insulation panel 22 to thereby construct a pressure connecting terminal portion 24b as the pressure connecting terminal member comprising a bite connecting groove 23a formed in an upper end of the bus bar end portion at an intermediate position in a transverse direction thereof and having opposite pressure connecting teeth.

Then, the upper portions of the respective pressure connecting terminal portions 23b, 24b are inserted through the slit 13 from below for bite connection with the single-core wire 15 using the respective bite connecting grooves 23a, 24a, whereby the wiring pattern 11 of the printed-wiring board 10 and the respective bus bars 23, 24 of the junction block can be connected to each other.

Even with the circuit connection structure according to this second embodiment, an advantage similar to the advantage obtained with the first embodiment can also be obtained, and this structure can be applied to an interlaminar connection for the respective bus bars 23, 24. This feature can also help improve the degree of freedom in designing the cabling for junction blocks.

Figure 5:
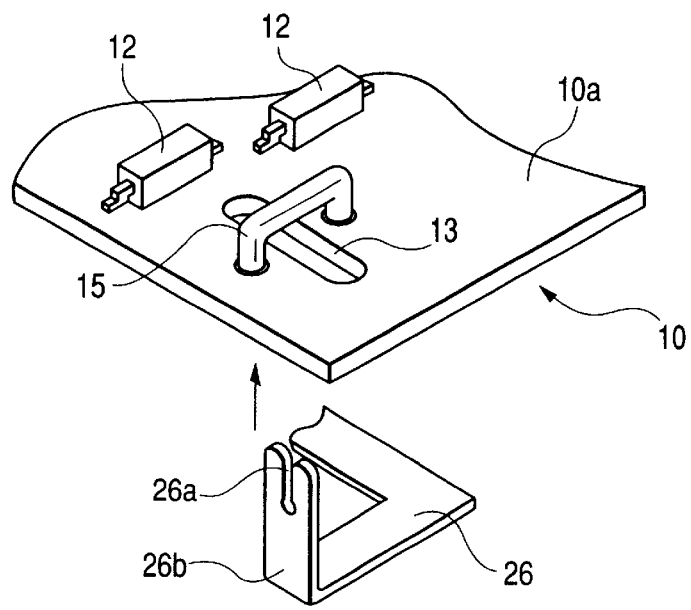
FIG. 5 is an exploded perspective view showing a third embodiment of the present invention.

FIG. 5 shows a third embodiment of the present invention, and like reference numerals are given to constituent components like to those described in the first embodiment, and the description thereof will be omitted.

Namely, in this third embodiment, the single-core wire 15 is soldered with a through-hole method. In other words, the end portions of the single-core wire 15 are inserted through through-hole portions formed in the substrate main body 10a for flow soldering thereat.

In addition, an end portion of the bus bar 26 as a cabling conductive portion within the junction block is bent upwardly to thereby construct a pressure connecting terminal portion 26b as the pressure connecting terminal member comprising a bite connecting groove 26a formed in an upper end of the bus bar end portion at an intermediate position in a transverse direction thereof and having opposite pressure connecting teeth.

Then, the upper portion of the pressure connecting terminal portion 26b is inserted through the slit 13 from below for bite connection with the single-core wire 15 using the bite connecting groove 26a, whereby the circuit conductive portion of the printed-wiring board 10 and the bus bar 26 of the junction block can be connected to each other.

Even with the circuit connection structure according to this embodiment, an advantage similar to the advantage obtained with the first embodiment can also be obtained.

Figure 6:
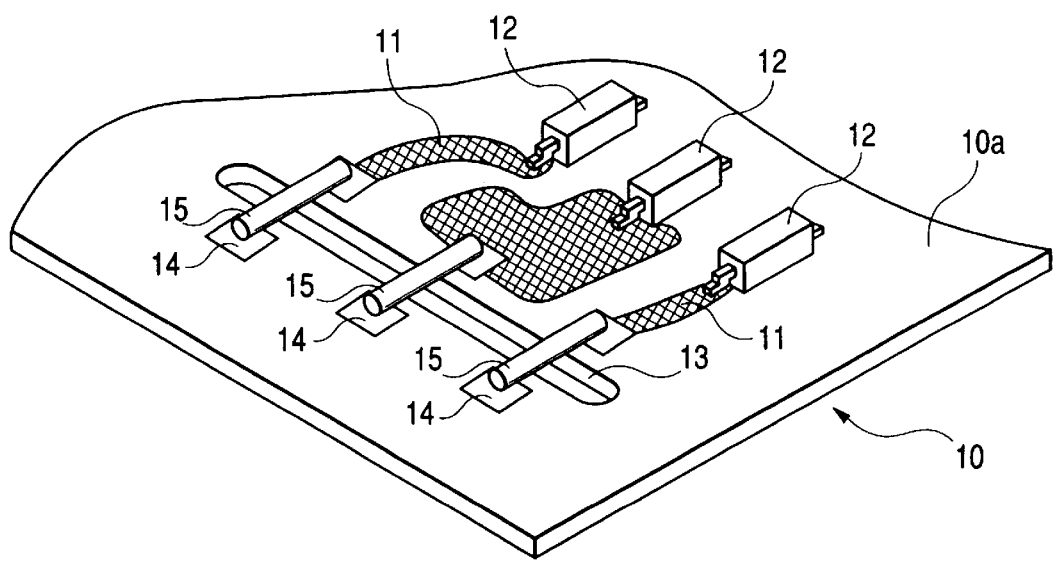
FIG. 6 is an exploded perspective view showing a fourth embodiment of the present invention.

FIG. 6 shows a fourth embodiment of the present invention, like reference numerals are given to constituent components like to those described in the above respective embodiments, and the description thereof will be omitted.

In other words, in this fourth embodiment, the slit 13 is formed into a longer elongated shape, and a plurality of land portions 14 (in this embodiment, three on each side) are provided on both sides of the slit 13 along the longitudinal direction thereof at predetermined intervals in such a manner that the land portions 14 on each side of the slit confront each other. Then, single-core wires 15 are disposed so as to extend between the respective land portions on each side of the slit for soldering thereat.

The cabling conductive portions within the junction block which are to be connected to the respective single-core wires 15 are constructed in the same manner as those described in the aforesaid respective embodiments, and they are connected to each other in the same manner as those described in the same embodiments.

Even with the circuit connection structure according to this embodiment, an advantage similar to the advantage obtained with the first embodiment can also be obtained, and this construction can be used as a substitute connection structure for the conventional connector 3 comprising a plurality of junction terminals 1 provided in parallel within the housing 2, this allowing the omission of a large-scale connector for the economy of space.

In addition, in a case where the conventional connector 3 is mounted in which a plurality of junction terminals 1 are built in the housing, although a great restriction is imposed on the housing 2 mounting position in designing patterns for the printed-wiring board 10, the embodiment of the invention is free from the restriction, whereby the degree of freedom in designing the cabling for circuits can be improved.

In this embodiment, the surface mounting method is described as being used for mounting the respective single-core wires 15, but the through-hole method may be used.

Figure 7:
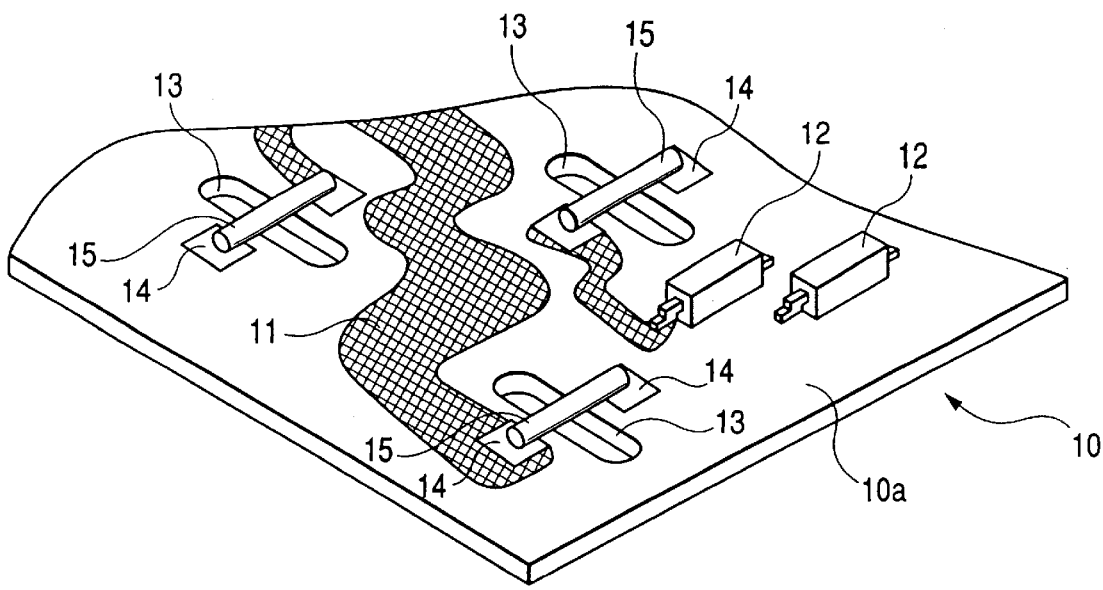
FIG. 7 is an exploded perspective view showing a fifth embodiment of the present invention.
Figure 8:
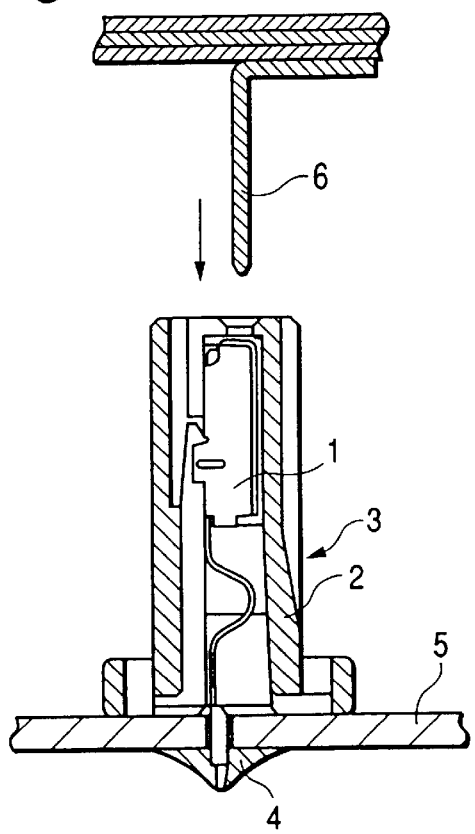
FIG. 8 is a sectional view showing a main part of a conventional example.

FIG. 7 shows a fifth embodiment of the present invention, and like reference numerals will be given to constituent components like to those described in the first embodiment, and the description thereof will be omitted.

In other words, in this embodiment, a plurality of slits 13 are formed suitably dispersedly in the substrate main body 10a, and land portions 14 are provided on each side of the respective slits 13. Single-core wires 15 are disposed so as to extend between the respective confronting land portions on each side of the slits and are soldered thereat.

Cabling conductive portions provided within the junction block so as to be connected to the respective single-core wires 15 are constructed similarly to those described in the above respective embodiments, and the same conductive portions and the single-core wires 15 are connected to each other in the similar manner to those previously described.

Even with the circuit connection structure according to this embodiment, an advantage similar to that obtained with the first embodiment can be obtained, and the connection points to which the respective single-core wires 15 are connected can be determined freely, whereby in designing the wiring pattern 11 on the printed-wiring board 10, the degree of freedom in designing the cabling pattern can be improved.

In this embodiment, the surface mounting method is described as being used for mounting the respective single-core wires 15, but the through-hole method may be used.

Even in the second to fifth embodiments, an electric wire comprising twisted wires may be used for the single-core wire 15.

As has been described heretofore, according to the circuit connection structure according to the present invention, the slit is formed in the substrate main body of the printed-wiring board, and the land portion is provided on each side of the slit. At least one of the land portions is connected to the circuit conductive portion, and the electric wire is disposed to extend between the land portions and is soldered thereat. The pressure connecting terminal member provided on the cabling conductive portion and having a bite connecting groove for the electric wire is bite connected to the electric wire through the slit. This obviates the necessity of the conventional housing and functions to save on space and reduce the number in components used and space required for the circuit connection. In addition, stress relaxation and stress adjustment can be effected against thermal stress or stress due to vibration by controlling the elasticity and length of the electric wire mounted on the printed-wiring board, whereby the reliability in circuit connection can be improved. Furthermore, since the necessity of the housing is obviated, the circuit connection structure can easily be applied to any position on the printed-wiring board, this providing the advantage that the degree of freedom in designing cabling for the junction block can also be improved.

In addition, the plurality of land portions are provided on each side of the slit in such a manner as to confront each other across the slit, the electric wire is, respectively, disposed so as to extend between the confronting land portions and is soldered thereat, and the plurality of pressure connecting terminal members are provided for bite connecting with the respective electric wires. This circuit connection structure can be used as the substitute connection structure for the conventional connector in which the plurality of junction terminals are provided in parallel in the housing, and this allows the omission of the large-scale connector to thereby save on space. The more the number in polarities to be connected increases, the more the space-economy advantage is exhibited, and the degree of freedom in designing cabling for circuits can be improved.

Moreover, the plurality of slits are formed in the substrate main body, and the land portions are provided on each side of the respective slits in such a manner as to confront each other across the slit, the electric wire is, respectively, disposed so as to extend between the confronting land portions and is soldered thereat, and the pressure connecting terminal member is provided for bite connecting with the respective electric wires. With this circuit connection structure, the connecting points can freely be determined for the respective electric wires, and the degree of freedom in designing cabling patterns can be improved when designing the wiring pattern on the printed-wiring board.

What is claimed is:

1. A circuit connection structure for a junction block for connecting a circuit conductive portion of a printed-wiring board with a cabling conductive portion within said junction block, comprising:

a slit formed through a substrate main body of said printed-wiring board, land portions being provided on both sides of said slit, at least one of said land portions being connected to said circuit conductive portion, an electric wire disposed to extend between said land portions and being soldered to said land portions at end portions of the electric wire, the land portions and the end portions of the electric wire being pressed by a presser fixture; and a pressure connecting terminal member provided on said cabling conductive portion and having a biting connection groove for said electric wire biting on said electric wire for connection therewith through said slit.

2. A circuit connection structure for a junction block as set forth in claim 1, wherein said electric wire is a single-core wire having a core portion comprising a single conductive wire.

3. A circuit connection structure for a junction block as set forth in claim 1, wherein a plurality of said land portions are provided on each side of said slit in such a manner as to confront each other across said slit, wherein said electric wire is soldered, respectively, to the plurality of said confronting land portions at end portions of said electric wire on each side of said slit, said electric wire each being disposed to extend between said confronting land portions, and wherein a plurality of said pressure connecting terminal portions are provided for biting on said respective electric wires for connection therewith.

4. A circuit connection structure for a junction block as set forth in claim 1, wherein a plurality of said slits are formed through said substrate main body; and wherein said land portions are provided on both sides of each of said plurality of said slits and said electric wire is soldered to said land portions at end portions of said electric wire on the both sides of each of said plurality of said slits, said electric wire being disposed to extend between said land portions, and wherein said pressure connecting terminal member is provided for said respective electric wires for bite connecting therewith.

5. A circuit connection structure for a junction block for connecting a circuit conductive portion of a printed-wiring board with a cabling conductive portion with a pair of bus bar members within said junction block, comprising:

a slit formed through a substrate main body of the printed-wiring board, land portions provided on both sides of said slit, at least one of said land portions connected to said circuit conductive portion, an electric wire disposed to extend between said land portions and being soldered to said land portions;

an insulating panel having an upper side and a lower side;

a first bus bar member disposed on the upper side and bent upwardly to form a first pressure connecting terminal member having a first biting connection groove; and a second bus bar member disposed on the lower side and bent upwardly to extend through the insulating panel and form a second pressure connecting terminal member having a second biting connection groove;

wherein the first and second biting connection grooves bite on said electric wire for connection therewith through the slit.

\* \* \* \* \*